United States Patent
Jensen et al.

(10) Patent No.: US 6,507,222 B1
(45) Date of Patent: Jan. 14, 2003

(54) HIGH SPEED SINGLE ENDED SENSE AMPLIFIER

(75) Inventors: Robert A. Jensen, Austin, TX (US); Dimitris C. Pantelakis, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/911,334

(22) Filed: Jul. 23, 2001

(51) Int. Cl.[7] ............................................. G01R 19/00
(52) U.S. Cl. ............................................. 327/51; 327/54
(58) Field of Search ............................. 327/51, 54, 55; 330/253; 365/207, 185.21, 230.08, 189.05

(56) References Cited

U.S. PATENT DOCUMENTS

| | | | |
|---|---|---|---|
| 5,615,161 A | * 3/1997 | Mu | 327/57 |
| 6,031,775 A | * 2/2000 | Chang et al. | 327/54 |
| 6,246,632 B1 | * 6/2001 | Seyyedy et al. | 365/189.05 |
| 6,268,747 B1 | * 7/2001 | Barnes | 327/55 |
| 6,297,670 B1 | * 10/2001 | Chao et al. | 327/51 |
| 6,310,501 B1 | * 10/2001 | Yamashita | 327/55 |

* cited by examiner

Primary Examiner—Timothy P. Callahan
Assistant Examiner—Linh Nguyen
(74) Attorney, Agent, or Firm—Skjerven, Morrill LLP

(57) ABSTRACT

An apparatus and method for processing a data input signal with a single ended sense amplifier. The single ended sense amplifier includes a transmission gate circuit and a control circuit coupled between a feedback inverter circuit and an output signal that is fed back to the feedback inverter circuit. An inverter circuit is coupled between an enable signal and the transmission gate and control circuits. During pre-charge operation, the input to the feedback inverter circuit is driven to a first state. The feedback inverter correspondingly drives the input signal to a sensing inverter to a state that is complementary to the input to the feedback inverter circuit, thereby assisting the pre-charge mode and substantially reducing time delay due to the input signal contending with the feedback inverter circuit. One advantage of the present invention is that sense amplifiers can be sized for faster sensing than would other-wise be feasible due to the excessive contention during the pre-charge mode.

23 Claims, 5 Drawing Sheets ized down, making higher operating speeds possible, except for the pre-charge contention problem introduced by transistors 110, 112 of sensing inverter circuit 106.

HIGH SPEED SINGLE ENDED SENSE AMPLIFIER

BACKGROUND

Single ended sense amplifiers have been used in both embedded and stand alone memory chips, digital signal processors, mixed signal processors, and microprocessors. While slower in speed, they offer lower power and higher noise immunity compared to a differential sense amplifier, and are adapted to requiring only one input data signal.

The configuration and size of transistors in a single-ended sense amplifier circuit are such that a feedback inverter contends with a pre-charge transistor for a substantial period of time during the pre-charge operation. This contention impacts the speed of the sense amplifier circuit by requiring a longer pre-charge period. This impact becomes quite severe when the transistors of the sense amplifier circuit are sized for quicker sensing.

It is therefore desirable to provide a high-speed single ended sense amplifier circuit for use in electronic components.

SUMMARY

In accordance with the present invention, an apparatus and method for processing a data input signal with a single ended sense amplifier is provided. The single ended sense amplifier includes a transmission gate circuit and a control circuit coupled between a feedback inverter circuit and an output signal that is fed back to the feedback inverter circuit through said transmission gate. An inverter circuit is coupled between an enable signal and the transmission gate and control circuits. During pre-charge operation, the input to the feedback inverter circuit is driven to a first state, such as high or low. The feedback inverter correspondingly drives the input signal to a sensing inverter to a state that is complementary to the first state, thereby assisting the pre-charge mode and substantially reducing time delay due to the input signal contending with the feedback inverter circuit.

In one embodiment, the single ended sense amplifier circuit includes a pre-charge circuit, and a sensing inverter circuit coupled to receive an input signal charged by the pre-charge circuit. The sensing inverter circuit generates an output signal. A feedback inverter circuit receives the input signal and the output signal, and a transmission gate circuit is coupled between the feedback inverter circuit and the output signal.

One feature of the high-speed single ended sense amplifier circuit is a control circuit coupled to the transmission gate circuit and to the feedback inverter circuit to assist pre-charge of the input through the feedback inverter.

Another feature is an inverter circuit coupled to receive an enable signal. The inverter circuit generates an inverted enable signal to control the transmission gate circuit and drive the control circuit. The control circuit can include a NMOS transistor and the pre-charge circuit can include a PMOS transistor. At the end of pre-charge operation, the enable signal goes high, the control transistor is turned off allowing the input data to flow through the sense amplifier with no contention.

The control circuit can alternatively include a PMOS transistor, and the precharge circuit can include a NMOS transistor. At the end of pre-charge operation, the enable signal goes low, the control transistor is turned off allowing the input data to flow through the sense amplifier with no contention.

A high-speed single ended sense amplifier circuit in accordance with the present invention can be included in a variety of devices, such as a digital signal processor, a memory device, and a mixed signal processing device.

In another embodiment, a method for sensing data input in accordance with the present invention includes:
  receiving an input data signal;
  receiving an enable signal;
  pulling the input data signal to a first state during a pre-charge mode;
  inverting the enable signal;
  receiving the inverted enable signal in a control circuit; and
  pulling a feedback inverter input to a state that is complementary to the first state with an output signal from the control circuit.

The method in accordance with the present invention can further include:
  outputting a sense amplifier output signal based on the data input signal;
  receiving the enable signal and the inverted enable signal in a transmission gate circuit; and
  feeding back the sense amplifier output signal to the feedback inverter through the transmission gate.

One advantage of the present invention is that sense amplifiers can be sized for faster sensing than would otherwise be feasible due to the excessive contention during the pre-charge mode.

These and other embodiments of the invention are further described below with respect to the following figures.

DETAILED DESCRIPTION

Figure 1:
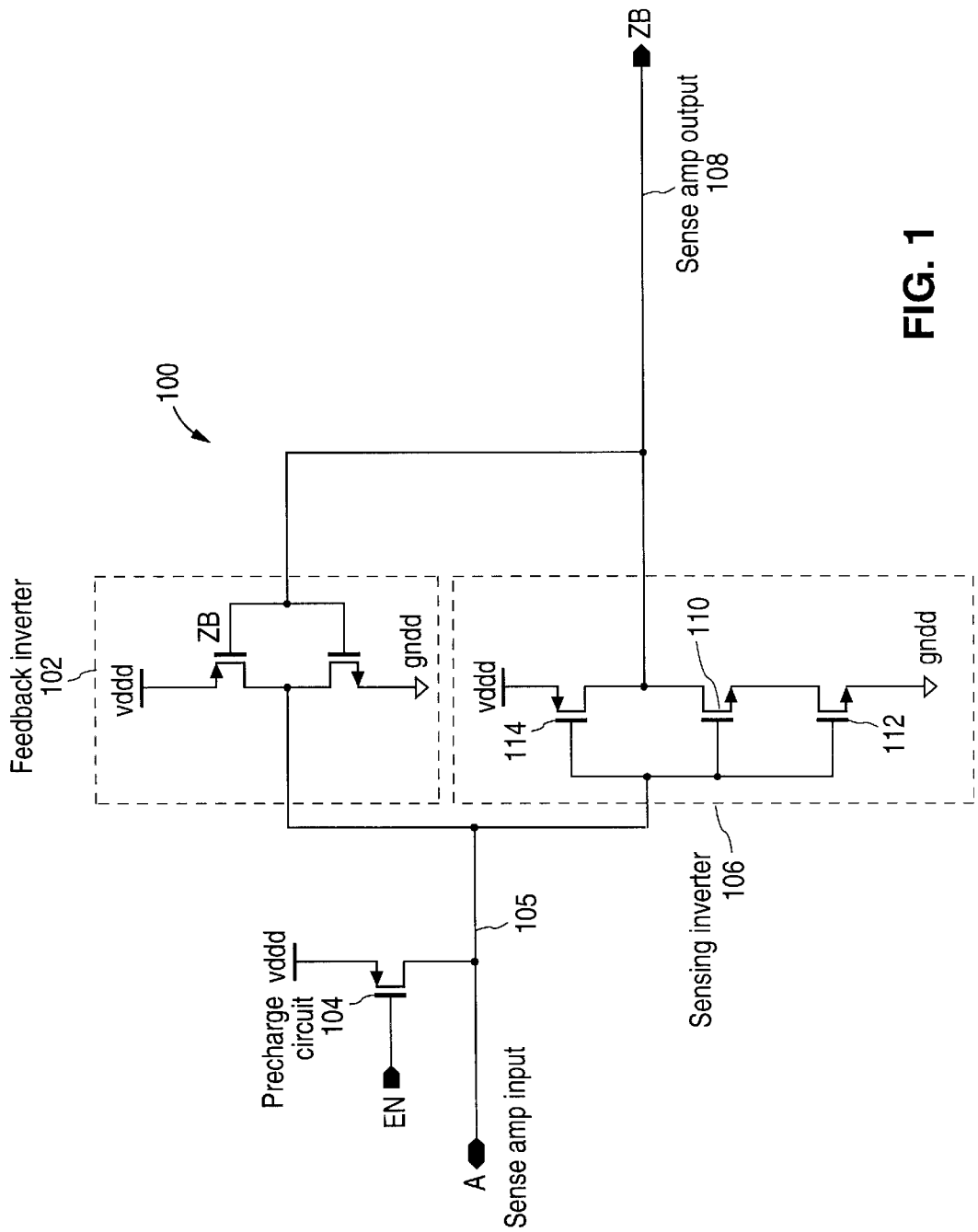
FIG. 1 is a schematic diagram of a single ended sense amplifier.

A single ended sense amplifier circuit 100 consists of a feedback inverter circuit 102, a pre-charge circuit 104, and a sensing inverter circuit 106 as illustrated in FIG. 1. Sensing inverter circuit 106 receives input signal 105 and outputs signal 108. Output signal 108 is also the input signal to the feedback inverter circuit 102. The feedback inverter circuit 102 weakly drives the input signal 105, and the pre-charge circuit 104 pulls the input signal 105 high during the pre-charge mode. The feedback inverter circuit 102 prevents the input data line from being undriven when sensing inverter circuit 106 is in power down mode or sense mode.

The NMOS transistors 110, 112 of sensing inverter circuit 106 are relatively weak compared to the PMOS transistor 114 of sensing inverter circuit 106. Sensing inverting 106 therefore has a high switching point and a strong bias toward a high output. The speed of sensing inverter circuit 106 can be increased by increasing the difference in strength between the NMOS transistors 110, 112 and PMOS transistor 114, however, this increases the contention period between feedback inverter circuit 102 and pre-charge circuit 104 during the pre-charge period. The impact of the contention becomes more severe as the difference in strength between transistors 110, 112 and the PMOS transistor 114 in sensing inverter circuit 106 increases.

At the beginning of the evaluation phase, the sense amplifier input signal 105 changes from a "1" to a "0." The sense amplifier output signal 108 causes the feedback inverter circuit 102 to contend with the sense amplifier input signal 105 for a portion of the evaluation period. This also impacts the speed of the single ended sense amplifier circuit 100.

Figure 2:
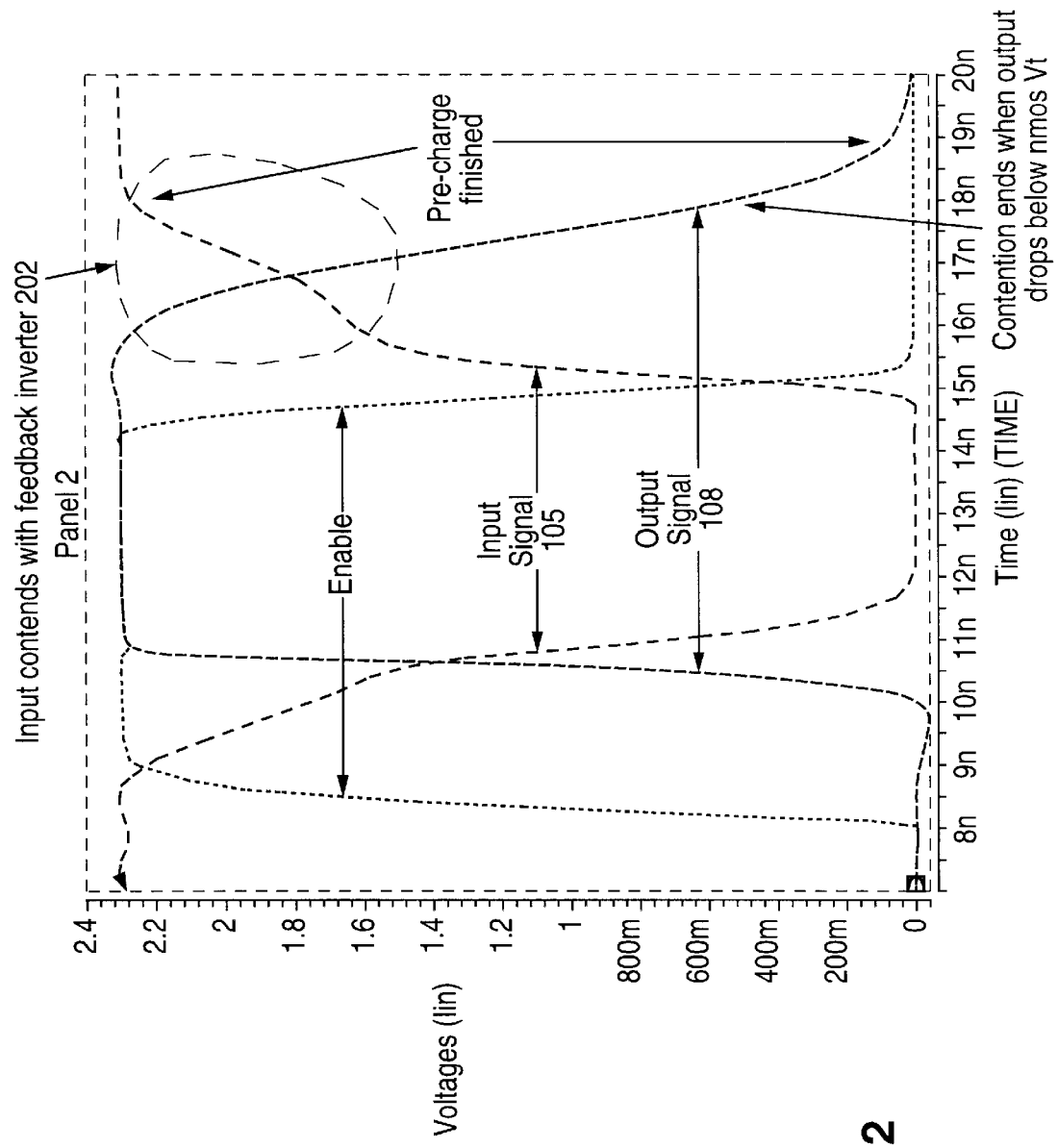
FIG. 2 is a time history diagram showing contention between the input signal and the output signal in the single ended sense amplifier of FIG. 1.

FIG. 2 shows a time history of the contention and speed penalty between input signal 105 and output signal 108 during a simulation of the single ended sense amplifier circuit 100. As shown in area 202 in FIG. 2, the input signal 105 and consequently the output signal 108, is delayed during pre-charge switching by the feedback inverter circuit 102. The effect of the delay is a speed penalty during functions such as reading a memory block.

Figure 3:
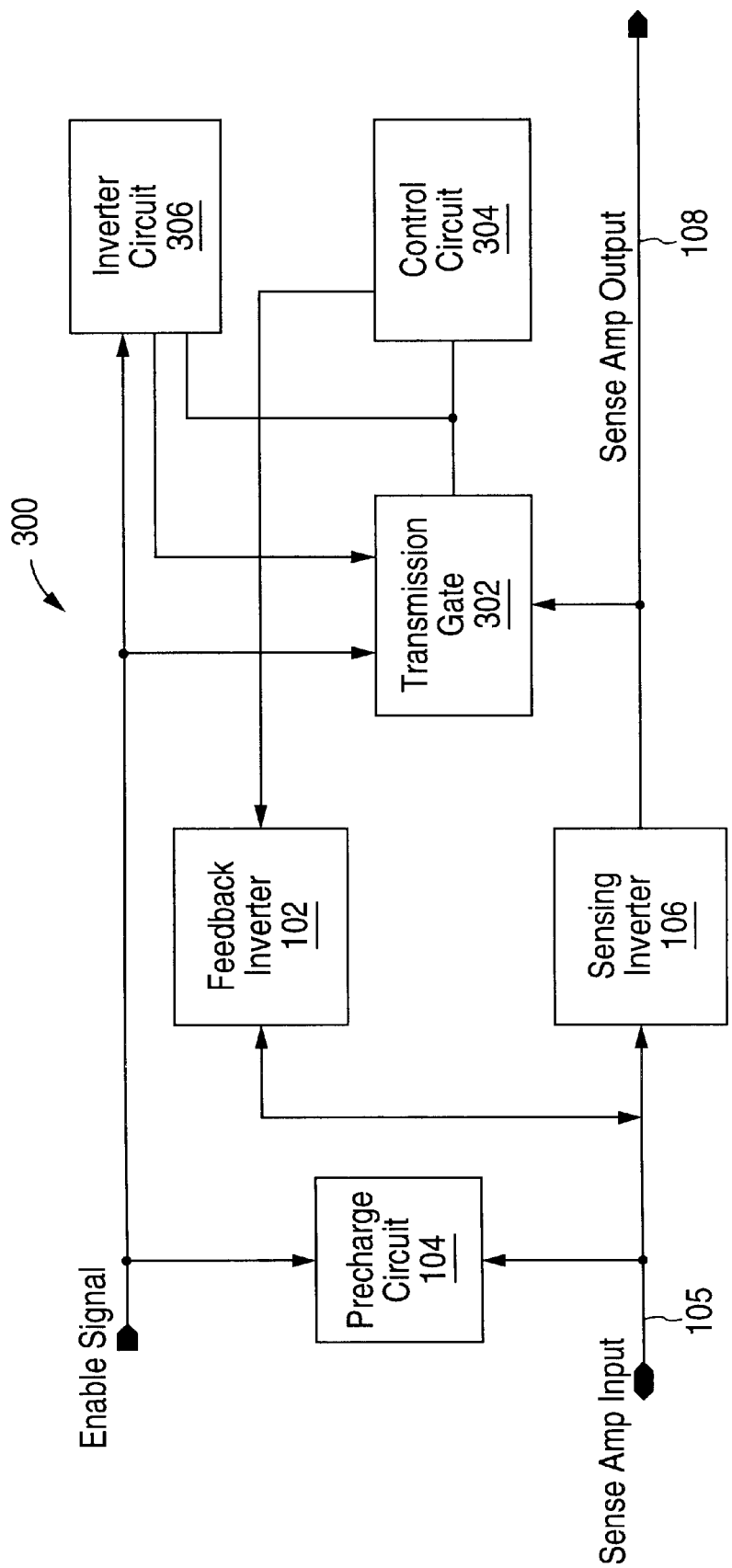
FIG. 3 is a block diagram of a high-speed single ended sense amplifier in accordance with the present invention.
Figure 3A:
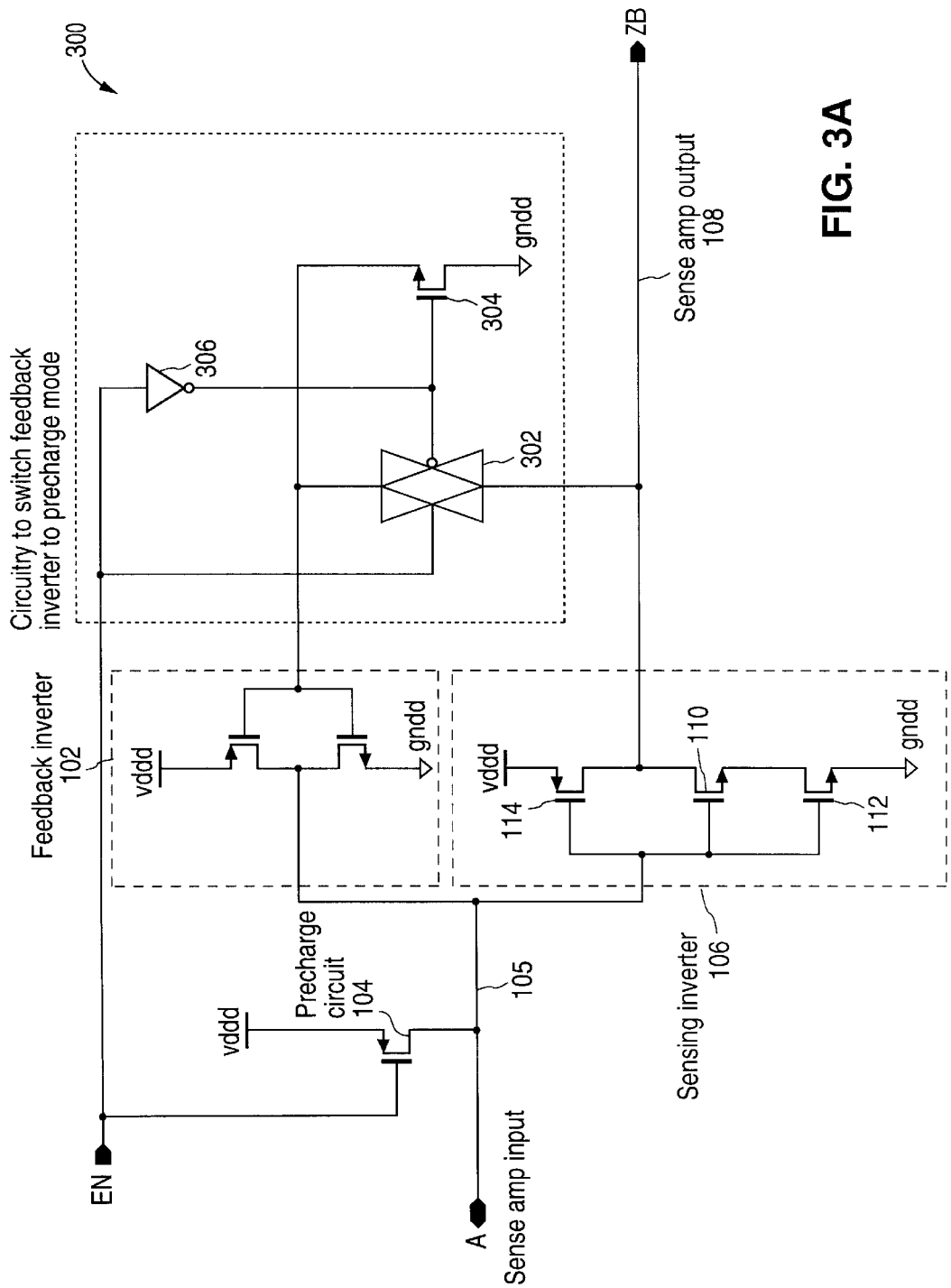
FIG. 3a is a schematic diagram of an implementation of the high speed single ended sense amplifier shown in FIG. 3

FIG. 3 is a block diagram of an embodiment of a high-speed single ended sense amplifier 300 in accordance with the present invention. FIG. 3a is a schematic diagram of an implementation of the high speed single ended sense amplifier shown in FIG. 3. Sense amplifier 300 includes a transmission gate circuit 302 between output signal 108 and the feedback inverter circuit 102. A control circuit 304, shown for example as a NMOS transistor in FIG. 3a, is also included at the input to the feedback inverter circuit 102. An inverter circuit 306, shown in symbolic form in FIG. 3a, is also included to enable the control circuit 304 and the transmission gate circuit 302. In the implementation shown in FIG. 3a, the inverter circuit 306 includes a PMOS and a NMOS transistor that pull the input to the feedback inverter circuit 102 to a low state with the control circuit 304, thereby driving the input signal 105 to a complementary high state during the pre-charge period. This assists the pre-charge effort and avoids contention, thus substantially eliminating the time delay due to the contention between the input signal 105 and the feedback inverter circuit 102.

During the evaluation period, the transmission gate circuit 302 is conductive, thus allowing the normal sensing feedback to occur. The inverter circuit 306 generates a complementary control signal for the transmission gate circuit 302 and control circuit 304.

Figure 4:
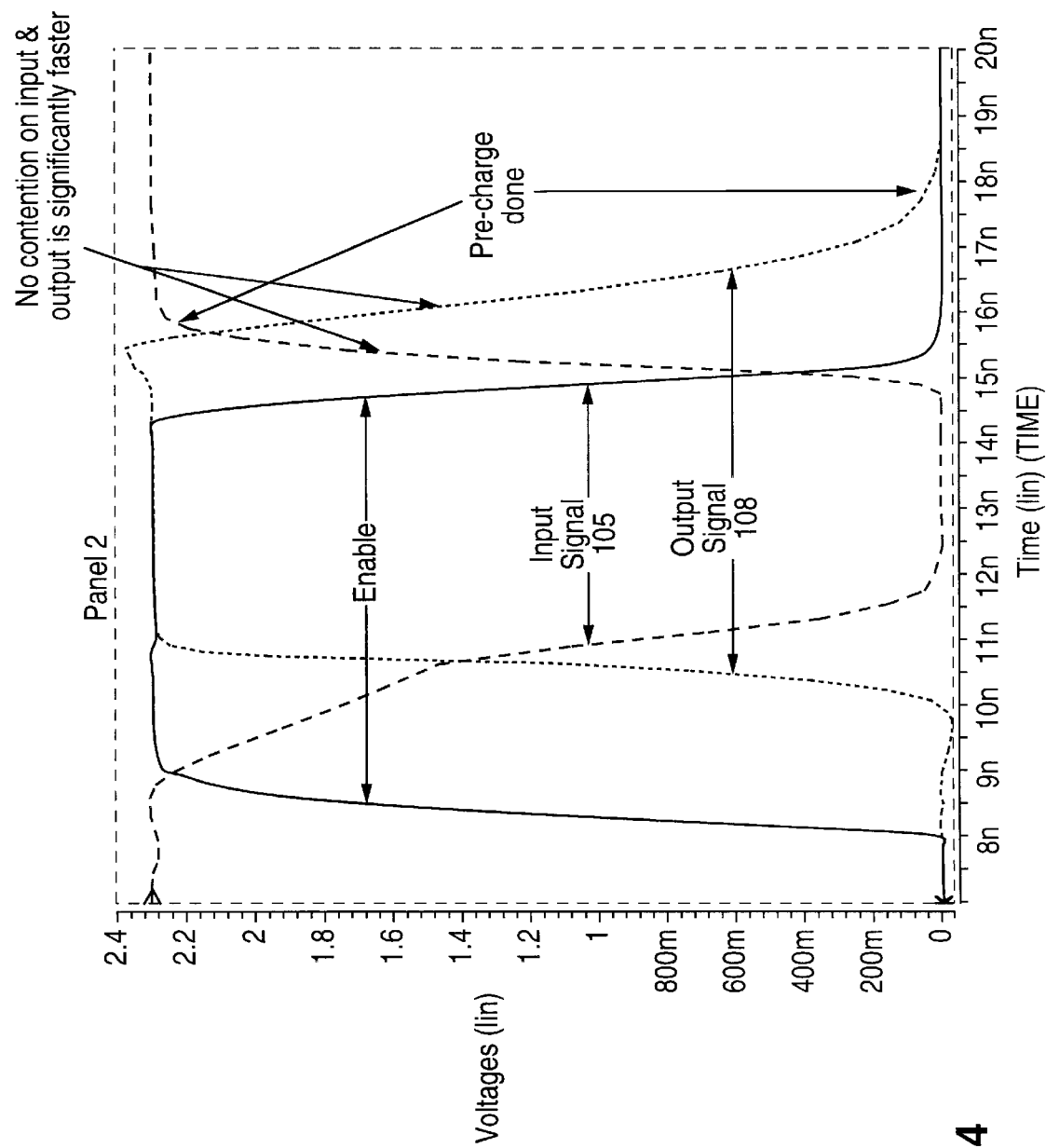
FIG. 4 is a time history diagram showing lack of contention between the input signal and the output signal in the high-speed single ended sense amplifier of FIG. 3.

FIG. 4 shows a time history of a simulation of the single ended sense amplifier circuit 300 in FIG. 3a using 0.25 micron CMOS technology. In this example, the output signal 108 transitions from 2.3 volts to approximately zero volts within 2.5 nanoseconds during the pre-charge period in FIG. 4. The time delay on the output signal 108 was reduced by 2 nanoseconds compared to the sense amplifier circuit 100 in FIG. 1, which required approximately 4 nanoseconds to transition from 2.3 volts to approximately zero volts. These speed comparisons will be different using other CMOS technology.

The pre-charge time required for input signal 105 is also significantly reduced by the high speed single ended sense amplifier circuit 300 compared to the single ended sense amplifier circuit 100. FIG. 4 shows the input signal 105 transitioning from zero volts to approximately 2.3 volts within 1 nanosecond, whereas FIG. 2 shows the input signal 105 required a much longer time period, specifically, 3.5 nanoseconds, to transition from zero volts to 2.3 volts. Thus, one advantage of the present invention is that sense amplifiers can be sized for faster sensing than would otherwise be feasible due to the excessive contention during the pre-charge mode.

In an alternate embodiment of a high-speed single ended sense amplifier in accordance with the present invention, control circuit 304 can include a PMOS transistor, instead of the NMOS transistor shown in FIG. 3a. In such an embodiment, the pre-charge circuit 104 includes a NMOS transistor. The inverter circuit 306 pulls the input to the feedback inverter circuit to a high state with the control circuit 304, thereby driving the input signal 105 to a complementary low state during the pre-charge period. This can be useful in applications where it is preferable to pre-charge the sense amplifier to ground (i.e., the low state).

The foregoing detailed description has set forth various embodiments of the present invention via the use of schematic diagrams and examples. It will be understood by those within the art that each schematic diagram component and operations and/or components illustrated by the use of examples can be implemented, individually and/or collectively, by a wide range of hardware.

The above description is intended to be illustrative of the invention and should not be taken to be limiting. Other embodiments within the scope of the present invention are possible. Variations and modifications of the embodiments disclosed herein can be made based on the description set forth herein, without departing from the spirit and scope of the invention as set forth in the following claims.

We claim:

1. A high-speed single ended sense amplifier circuit comprising:

a pre-charge circuit coupled to a sense amp input signal, wherein the pre-charge circuit is operable to pre-charge the sense amp input signal to a known state when the sense amplifier circuit is operating in a first mode;

a sensing inverter circuit coupled to receive the sense amp input signal, the sensing inverter circuit being operable to generate a sense amp output signal;

a feedback inverter circuit coupled to receive the sense amp output signal and weakly drive the sense amp input signal when the sense amplifier circuit is operating in a second mode; and a control circuit coupled to the feedback inverter circuit, the control circuit being operable to set the input of the feedback inverter to the complement of the known state when the sense amplifier circuit is operating in the first mode.

2. The high-speed single ended sense amplifier circuit, as set forth in claim 1, further comprising:

a transmission gate circuit coupled between the feedback inverter circuit and the sense amp output signal, the transmission gate circuit being operable to decouple the sense amp output signal from the feedback inverter circuit when the sense amplifier circuit is operating in the first mode.

3. The high-speed single ended sense amplifier circuit, as set forth in claim 1, further comprising:

an inverter circuit coupled to receive an enable signal, wherein the inverter circuit is operable to generate an inverted enable signal for input to the transmission gate circuit.

4. The high-speed single ended sense amplifier circuit, as set forth in claim 2, further comprising:

an inverter circuit coupled to receive an enable signal, wherein the inverter circuit is operable to generate an inverted enable signal for input to the control circuit.

5. A method for sensing data input, the method comprising:

receiving an input data signal;

receiving an enable signal;

pulling the input data signal to one state during a pre-charge mode;

inverting the enable signal;
receiving the inverted enable signal in a control circuit; and
pulling a feedback inverter to a state that is complementary to the one state with an output signal from the control circuit.

6. The method, as set forth in claim 5, further comprising:
outputting a sense amplifier output signal based on the data input signal;
receiving the enable signal and the inverted enable signal in a transmission gate circuit; and
feeding back the sense amplifier output signal to the feedback inverter through the transmission gate.

7. A method for sensing data input, the method comprising:
receiving an input data signal;
receiving an enable signal;
pulling the input data signal to one state during a pre-charge mode;
inverting the enable signal;
receiving the inverted enable signal in a control circuit;
outputting a sense amplifier output signal based on the data input signal;
receiving the enable signal and the inverted enable signal in a transmission gate circuit; and
feeding back the sense amplifier output signal to the feedback inverter through the transmission gate.

8. The method, as set forth in claim 7, further comprising:
pulling a feedback inverter to a state that is complementary to the one state with an output signal from the control circuit.

9. An apparatus for sensing data input comprising:
means for receiving an input data signal;
means for receiving an enable signal;
means for pulling the input data signal to one state during a pre-charge mode;
means for inverting the enable signal;
means for receiving the inverted enable signal in a control circuit; and
means for pulling a feedback inverter to a state that is complementary the one state with an output signal from the control circuit.

10. The apparatus, as set forth in claim 9, further comprising:
means for inverting the input data signal.

11. The apparatus, as set forth in claim 9, further comprising:
means for outputting a sense amplifier output signal based on the data input signal;
means for receiving the enable signal and the inverted enable signal in a transmission gate circuit; and
means for feeding back the sense amplifier output signal to the feedback inverter through the transmission gate.

12. A high-speed single ended sense amplifier circuit comprising:
a pre-charge circuit coupled to sense amp input signal and operable to charge the sense amp input signal to a known state when the sense amplifier circuit is in a first mode;
a sensing inverter circuit coupled to receive the sense amp input signal and operable to generate a sense amp output signal when the sense amplifier circuit is in a second mode;
a feedback inverter circuit having an input coupled to receive the sense amp output signal and an output coupled to the sense amp input signal, the feedback inverter circuit operable to weakly drive the sense amp input signal when the sense amplifier circuit is in the second mode;
a transmission gate circuit coupled between the feedback inverter circuit and the sense amp output signal, the transmission gate circuit operable to decouple the sense amp output signal from the feedback inverter circuit when the sense amplifier circuit is in the first mode and further operable to couple the sense amp output signal to the feedback inverter circuit when the sense amplifier circuit is in the second mode; and
a control circuit coupled to an input of the feedback inverter circuit and operable to assist the pre-charge circuit to charge the sense amp input signal to the known state when the sense amplifier circuit is in the first mode.

13. The high-speed single ended sense amplifier circuit, as set forth in claim 12, wherein the control circuit includes a NMOS transistor.

14. The high-speed single ended sense amplifier circuit, as set forth in claim 15, wherein the inverter circuit includes a PMOS transistor and a NMOS transistor.

15. The high-speed single ended sense amplifier circuit, as set forth in claim 12, further comprising:
an inverter circuit coupled to receive an enable signal, wherein the inverter circuit is operable to generate an inverted enable signal for input to the transmission gate circuit and the control circuit.

16. An apparatus for sensing data, the apparatus comprising:
a pre-charge circuit coupled to an input signal, wherein the pre-charge circuit is operable to charge the input signal to a known state;
a sensing inverter circuit coupled to receive the input signal, the sensing inverter circuit being operable to generate an output signal;
a feedback inverter circuit coupled to receive the output signal and to weakly drive the input signal;
a transmission gate circuit coupled between the feedback inverter circuit and the output signal;
a control circuit coupled to the transmission gate circuit and to the feedback inverter circuit; and
an inverter circuit coupled to receive an enable signal, wherein the inverter circuit is operable to generate an inverted enable signal for input to the transmission gate circuit and the control circuit.

17. The apparatus, as set forth in claim 16, wherein the control circuit includes a NMOS transistor.

18. The apparatus, as set forth in claim 16, wherein the control circuit includes a PMOS transistor.

19. The apparatus, as set forth in claim 16, wherein the inverter circuit includes a PMOS transistor and a NMOS transistor.

20. The apparatus, as set forth in claim 16, wherein the apparatus further comprises a digital signal processor.

21. The apparatus, as set forth in claim 16, wherein the apparatus further comprises a memory device.

22. The apparatus, as set forth in claim 16, wherein the apparatus further comprises a processing device.

23. The apparatus, as set forth in claim 16, wherein the apparatus further comprises a mixed signal processing device.

* * * * *